United States Patent [19]

Palara

[11] Patent Number: 5,606,278

[45] Date of Patent: Feb. 25, 1997

[54] CIRCUIT FOR LIMITING THE OUTPUT VOLTAGE OF A POWER TRANSISTOR

[75] Inventor: Sergio Palara, Aci Castello, Italy

[73] Assignee: SGS-Thomson Microelectronics S.r.l., Agrate, Italy

[21] Appl. No.: 520,616

[22] Filed: Aug. 30, 1995

[30] Foreign Application Priority Data

Nov. 30, 1994 [EP] European Pat. Off. ............ 94830556

[51] Int. Cl.[6] .................... H03K 5/08; H03K 17/00
[52] U.S. Cl. ................ 327/321; 327/439; 327/428; 327/478; 327/313
[58] Field of Search ................. 327/309, 317, 327/318, 321, 322, 324, 325–328, 108, 109, 110, 438–441, 453–454, 458, 459, 463, 468, 475, 478, 427–437, 313, 314, 310

[56] References Cited

U.S. PATENT DOCUMENTS

| | | | |
|---|---|---|---|
| 3,662,184 | 5/1972 | Johnson | 307/106 |
| 4,458,290 | 7/1984 | Miyashita | 361/152 |
| 4,642,491 | 2/1987 | Kenney et al. | 327/427 |
| 5,001,373 | 3/1991 | Bator et al. | 327/321 |
| 5,021,694 | 6/1991 | Toshiro et al. | 327/438 |
| 5,075,568 | 12/1991 | Bilotti et al. | 327/309 |
| 5,189,317 | 2/1993 | Palara et al. | 307/350 |
| 5,347,169 | 9/1994 | Preslar et al. | 327/436 |

FOREIGN PATENT DOCUMENTS

| | | | |
|---|---|---|---|
| 2732512 | 7/1977 | Germany | H03K 17/84 |
| 3546513A1 | 2/1987 | Germany | H03K 17/731 |

*Primary Examiner*—Toan Tran
*Attorney, Agent, or Firm*—Joseph C. Arrambide; Theodore E. Galanthay; Lisa K. Jorgenson

[57] ABSTRACT

A circuit for limiting the output voltage from a power transistor connected in series with a resonant load between a voltage supply and a voltage reference, ground, is disclosed. The circuit includes a semiconductor junction element, in particular a diode of the SCR type, having an anode terminal connected to the voltage supply, a cathode terminal connected to a common circuit node between the power transistor and the resonant load, and a control terminal connected to a reference voltage of predetermined value. The reference voltage can be constructed by using a resistor connected in series with a diode across the voltage supply. The SCR diode is constructed using the parasitic PNP-NPN transistors which exist in the structure of the power transistor.

20 Claims, 3 Drawing Sheets

CIRCUIT FOR LIMITING THE OUTPUT VOLTAGE OF A POWER TRANSISTOR

BACKGROUND

I. Field of the Invention

This invention relates to a circuit for limiting the output voltage from a power transistor employed to drive a resonant electric load which is connected to a voltage supply and more particularly to a circuit for limiting the output voltage from a power transistor used to drive an ignition coil or transformer in an automobile.

II. Prior Art

Most automobiles currently use gasoline powered engines which rely on spark plugs to ignite a fuel mixture in a combustion chamber. The combustion applies pressure to a piston which ultimately provides power to the automobile. The spark plugs ignite the fuel mixture by providing a spark at a controlled time, typically just after the piston passes through what is commonly known as top dead center. The spark of a spark plug is created by applying a high voltage, typically 40,000 volts, across the gap of the spark plug. In the past, the high voltage necessary to create the spark was generated with ignition points, a condenser, and an ignition coil. However, modern cars have replaced the ignition points with electronic ignition modules which utilize power devices such as bipolar transistors.

The invention concerns in particular, but not exclusively, a power device used in the automotive industry for driving an ignition coil or a transformer. For this purpose, either a single transistor of the bipolar type, or a pair of transistors in a Darlington configuration, or a MOS type of transistor are used as the power element.

FIG. 1 shows a power transistor T1 which is periodically turned on and off by a driver circuit 1 as controlled by an appropriate input signal Vin. In essence, the power transistor acts as a switch (ignition points) which is open or closed by the input signal supplied to the driver circuit. With the switch in the closed state, a current flows through the load. As the switch is opened, a positive overvoltage establishes between the load and the switch which is followed by a series of negative voltage peaks dependent on the parasitic capacitances of the load and the way the energy which has been stored in the load is discharged upon the switch being opened. This positive overvoltage and series of negative voltage peaks are shown in FIG. 2. These negative voltage peaks pull the output voltage of the device several volts below ground level. Where the driver circuit and power device are provided in the integrated circuit form, certain parasitic components associate with the active components of the driver circuit which, as said voltage drops below ground level, enter a conduction state, thereby shorting out the active components of the driver circuit and impairing the operation of the latter.

More specifically with reference in particular to the example of FIG. 1, an electric load ZL, schematically represented by its equivalent electric circuit R-L-C, is connected to a circuit node at a voltage Vs. The load ZL is driven by a power device, specifically a bipolar transistor T1 of the NPN type, which is turned on and off by a signal from a driver circuit 1, known per se, under control by an appropriate input signal Vin. The output voltage of the power device is designated Vc.

Shown in FIG. 2 is the pattern vs. time of the voltage Vc when the transistor T1 is in the off state. It can be seen that a positive voltage first establishes itself at said node, followed by a series of negative voltage peaks. These negative voltage peaks will pull the output voltage of the device even several volts below ground level. With reference to FIG. 3, shown in vertical section therein is a portion of the integrated structure of the circuit illustrated by FIG. 1. This portion comprises an N+ doped substrate, indicated as region 2, wherein a power transistor T1 is formed whose collector, base and emitter regions are respectively defined by regions 3, 7 and 8. Formed in the region 2 as a part of the driver circuit 1, is a second transistor T4 whose collector, base and emitter regions are respectively defined by regions 4, 9 and 6. The transistor T4 is contained in an isolation well formed of a buried region 5 of the P type and two regions 10, 11 of the P+ type. The integrated structure just described implies the presence of two parasitic transistors T5 and T6. The base of the transistor T5 is in common with the collector of the transistor T6, formed in the region 4 of the N+ type, its emitter is formed in the region 9 of the P type, and its collector is in common with the base of the transistor T6, in the region 5 of the P type. Lastly, the emitter of the transistor T6 is formed within the region 3 of the N type. The connection pattern of the parasitic transistors TS, T6 is illustrated in FIG. 3 by a wiring diagram superimposed on the cross-sectional representation of the integrated structure.

In order to prevent the power device output from attaining a negative voltage value relative to ground, thereby triggering on the parasitic components, a circuit must be connected to that output which can provide real time control of the output voltage to hold it within predetermined limits. A known technical approach to providing such a limiter circuit is disclosed in U.S. Pat. No. 5,189,317 issued on Feb. 23, 1993 and is herein incorporated by reference. The limiter circuit described in U.S. Pat. No. 5,189,317 includes a comparator which performs a comparison of the output voltage from the power device with a predetermined reference voltage. Where the output voltage is slightly below the reference voltage, the comparator supplies the load with a current effective to prevent the output voltage from dropping below the reference voltage. This prior approach, while being advantageous from many aspects, is a structurally complex one and uses up an area of the integrated circuit which accounts for a significant proportion of the total area of the device. Its structural complexity unavoidably implies, moreover, such added disadvantages as increased cost and rate of device rejects.

Therefore, it is an object of the invention to provide a limiter circuit as indicated, which has such structural and functional features as to prevent the output of the power device, that is its collector connected to the load, from attaining a negative voltage relative to ground and triggering on the parasitic components.

It is further an object of the invention to decrease the cost and rate of device rejects by simplifying the prevention solution over prior art solutions.

SUMMARY OF THE INVENTION

This invention can be summarized as a circuit for limiting the output voltage from a power transistor connected in series with a resonant load between a voltage supply and a voltage reference, ground. The circuit includes a semiconductor junction element, in particular a diode of the SCR type, having an anode terminal connected to the voltage supply, a cathode terminal connected to a common circuit node between the power transistor and the resonant load, and a control terminal connected to a reference voltage of predetermined value. The reference voltage can be constructed by using a resistor connected in series with a diode across the voltage supply. The SCR diode is constructed using the parasitic PNP-NPN transistors in the structure of a power transistor.

The features of this invention will be more clearly apparent from the following detailed description of embodiments thereof, shown by way of example and not of limitation in the accompanying drawings.

DETAILED DESCRIPTION OF THE PREFERRED EMBODIMENT

The principle of this invention will now be explained with reference to the embodiment shown in FIG. 4. The power device T1 consists of a bipolar transistor of the NPN type. The emitter of the transistor T1 is connected to ground, whilst its collector is connected to a load ZL, specifically a coil or a transformer. The load ZL represents the load of an ignition coil in an automobile as will be understood by persons skilled in the art. The other end of the load ZL is connected to a node at a voltage Vs which could be a battery voltage in an automobile. Associated with the collector of the transistor T1 is a limiter circuit 40 for its related output voltage Vc. The limiter circuit 40 includes a semiconductor junction element, in particular a controlled diode of the SCR type having an anode terminal A, a cathode terminal K, and a control terminal G. The anode terminal A is connected to the node at the voltage Vs, the cathode terminal K is connected to the common circuit node between the power transistor T1 and the resonant load ZL, and the control terminal G is connected to the positive pole of a generator E of a predetermined value. The negative pole of this generator is connected to the circuit ground.

Figure 5:
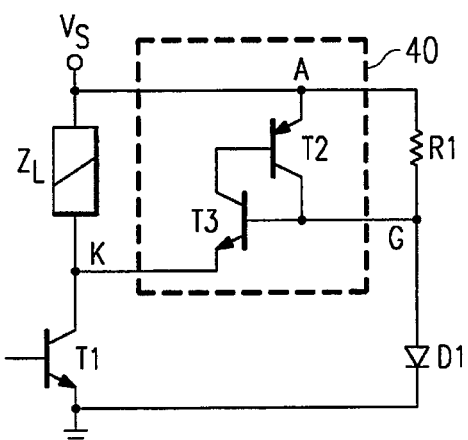
FIG. 5 shows a modified embodiment of the limiter circuit in FIG. 4, in accordance with the invention.

In the embodiment shown in FIG. 5, the controlled diode of the SCR type is formed of two transistors T2, T3 of a mutually complementary type. In particular, these transistors T2, T3 are bipolar transistors of the PNP and NPN type, respectively. The emitter of the first transistor T2 is the anode terminal A of the SCR diode, whereas the emitter of the second transistor T3 is the cathode terminal K of the diode. The collector of the first transistor T2 is connected to the base of the second transistor T3, and is the control terminal G of the SCR diode, and the base of the first transistor T2 is connected to the collector of the second transistor T3. Also shown in FIG. 5 is an embodiment of the fixed voltage generator E. This reference voltage is obtained through a diode D1 which is forward biased by a resistor R1. A terminal of this resistor is connected between the circuit node at the voltage Vs and the anode terminal of the diode D1, the cathode terminal of the diode D1 being connected to the circuit ground.

Figure 1:
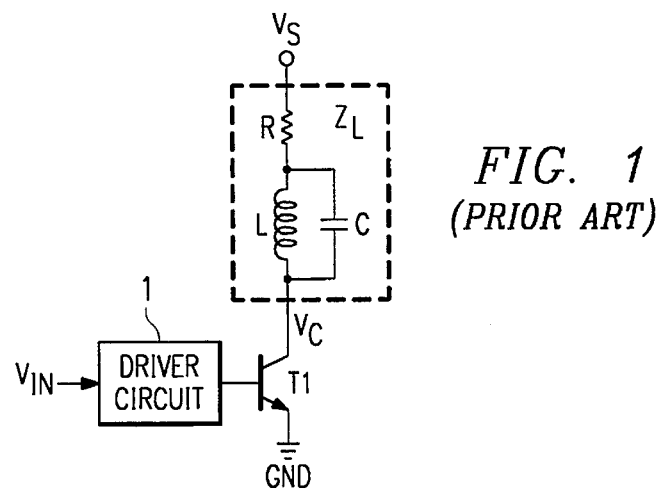
FIG. 1 is a diagram showing schematically a driver circuit and a power device with a load driven thereby, as known in the prior art.
Figure 2:
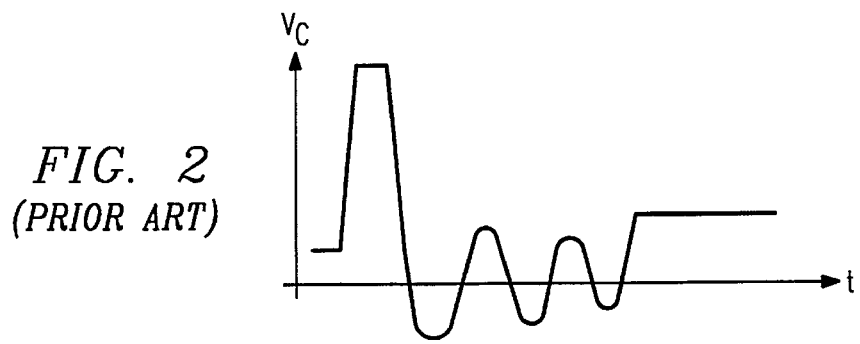
FIG. 2 illustrates the pattern vs. time of the voltage present at the output node of the power transistor, as known in the prior art.
Figure 4:
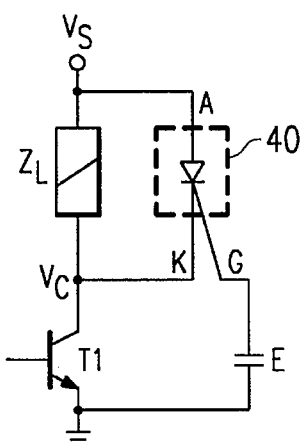
FIG. 4 is a wiring diagram of the power transistor and associated limiter circuit according to the invention.
Figure 6:
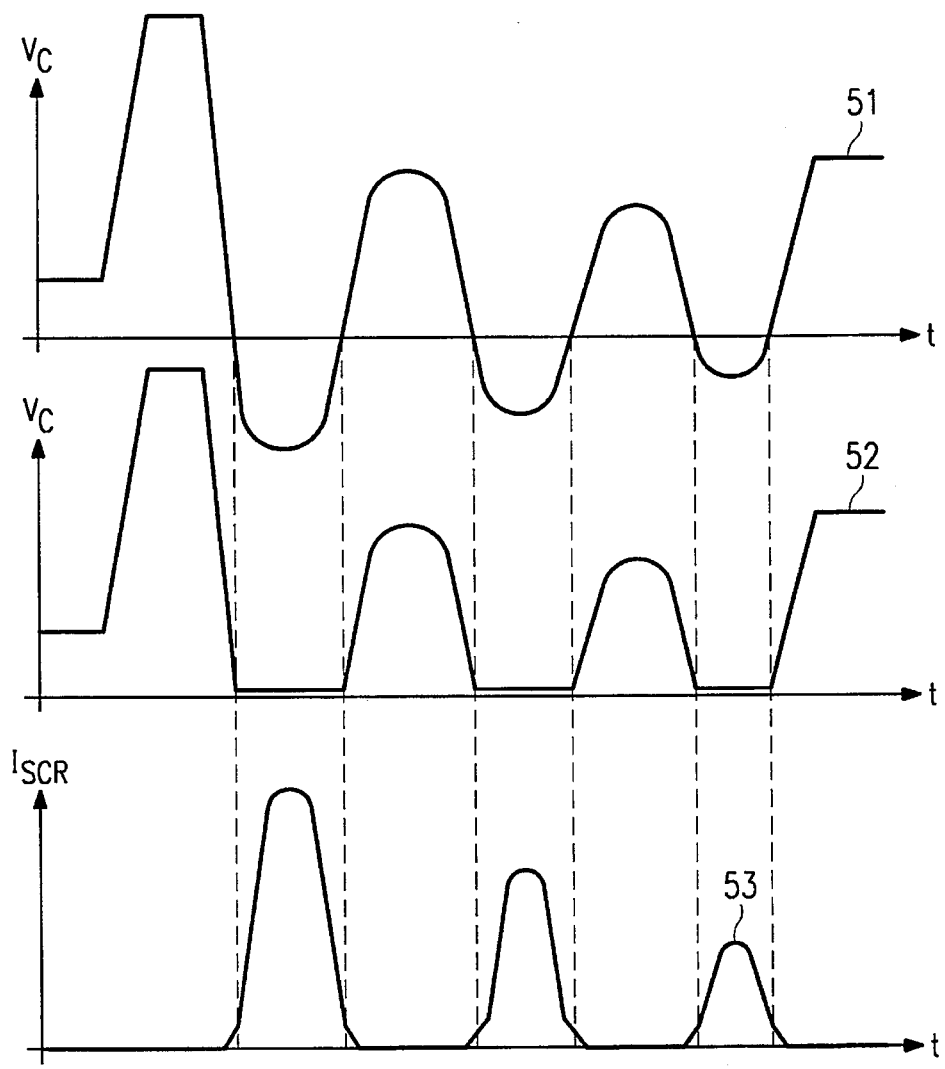
FIG. 6 shows the patterns vs. time of certain electric signals present in the circuits of the preceding Figures.

Shown in FIG. 6 is the pattern vs. time of certain electric quantities which appear in the circuits described in the foregoing and illustrated by FIGS. 1, 4 and 5. In particular, the curve designated 51 represents the pattern vs. time of the voltage Vc present at the output node of the power device as the transistor T1 is turned off and in the absence of a limiter circuit for said output voltage. It can be seen that a positive overvoltage first establishes itself at said node which is followed by a series of negative voltage peaks.

The curve designated 52 represents the pattern vs. time of the voltage Vc present at the output node of the power device as the transistor T1 is turned off, in the presence of the limiter circuit of this invention. It can be seen that the value of the voltage Vc remains positive all the time.

The curve designated 53 illustrates the pattern vs. time of the current Iscr through the diode 40 of the SCR type. The controlled diode 40 will be conducting when the voltage between the control terminal G and the cathode terminal exceeds a given threshold value, typically in the 0.6 to 0.7 volts range.

Figure 7:
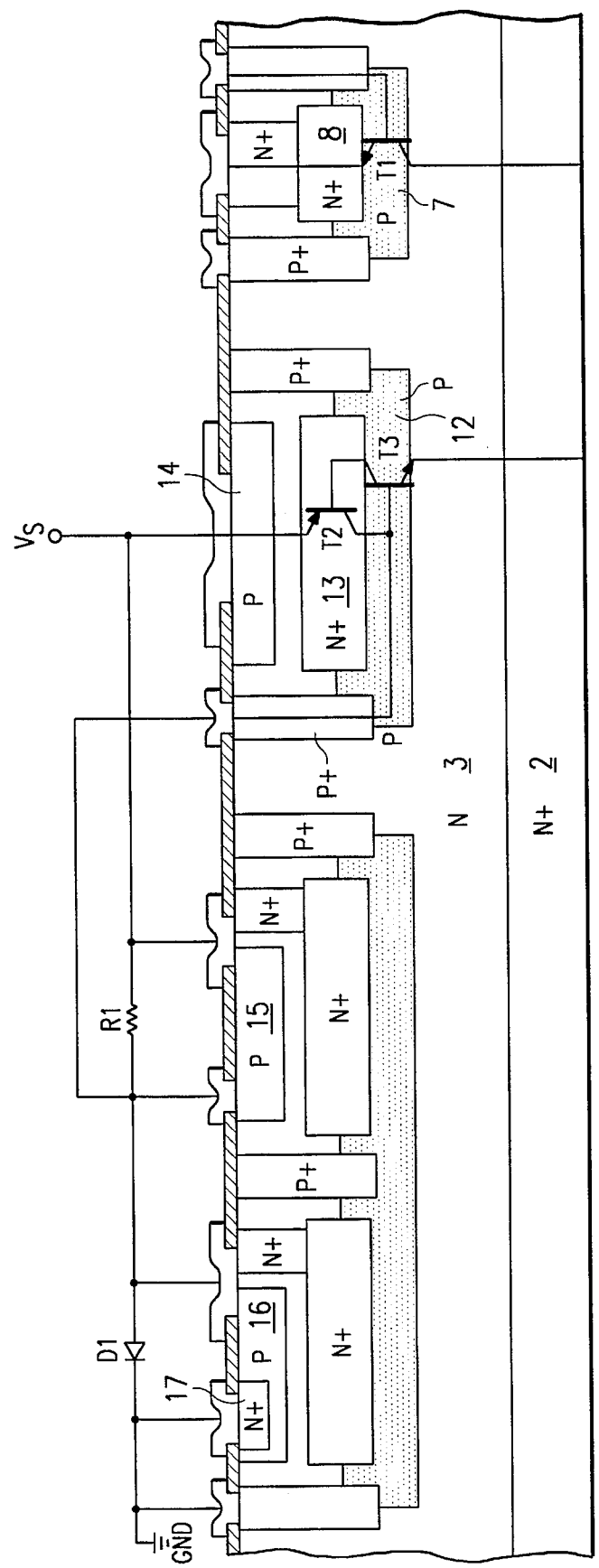
FIG. 7 is an enlarged vertical section showing schematically a portion of an integrated circuit incorporating the power transistor and limiter circuit of this invention.

Shown in FIG. 7 is a vertical section view of the integrated structure of the limiter circuit depicted schematically in FIG. 5, and of that of the power transistor T1. This structure comprises an N+ doped substrate, denoted by 2, wherein the power transistor T1, the two transistors T2 and T3, the resistor R1 and the diode D1 are formed. The collector, base and emitter regions of the power transistor T1 are respectively defined by the regions 3, 7 and 8. The two transistors T2, T3 of the limiter circuit in FIG. 5 are formed in four superimposed layers which are doped with impurities of the P type and the N type, alternately. More specifically, the base of the transistor T2 is in common with the collector of the transistor T3 in a region 13 of the N+ type; its emitter is formed in a region 14 of the P type; its collector is in common with the base of the transistor T3 in a region 12 of the P type; and the emitter of the transistor T3 is formed within the region 3 of the N type.

Figure 3:
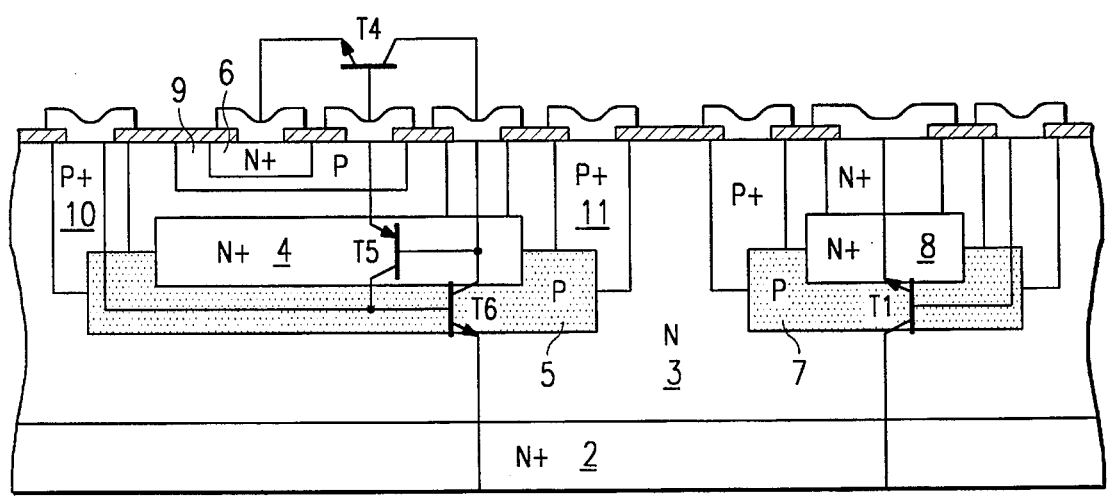
FIG. 3 is an enlarged vertical section view showing schematically a portion of an integrated circuit incorporating a prior art driver circuit and power transistor arrangement, as known in the prior art.

It will be appreciated that the structure of the regions forming such transistors substantially corresponds to the structure of the parasitic transistors T5, T6 present in the driver circuit portion shown in FIG. 3. This similarity of the two structures enhances the simplicity of the solution proposed, because it makes for extremely simple integration of the limiter circuit to the integrated circuit to be protected.

Formed in the region 2, again within the structure of FIG. 7, are also the resistor R1, defined in a region 15 of the P type, and the diode D1, having its anode formed in a region 16 of the P type and cathode formed in a region 17 of the N+ type. The wiring diagram of the integrated components just described is shown, again in FIG. 7, superimposed on the sectional view of the integrated structure.

As to the operation of the circuit of FIG. 4, the controlled diode of the SCR type, contained in the limiter circuit 40, will be conducting current as the voltage between the control terminal G and the cathode terminal K exceeds a given threshold value, typically in the 0.6 to 0.7 volts range. Since the voltage at the control terminal G of the diode SCR is held constant by the voltage generator E, the diode will be conducting as the voltage at its cathode terminal K reaches a value close to zero volts. The current supplied to the load by the diode SCR maintains the voltage Vc at the collector of the power transistor T1 positive, as shown by the curve 52 in FIG. 6.

In the embodiment shown in FIG. 5, the limiter circuit 40 comprises two transistors T2, T3, respectively of the PNP and NPN type, and the voltage reference E is formed by a diode D1 forward biased by a resistor R1. The base of the transistor T3, which represents the control terminal of the SCR diode, is connected to the anode of the diode D1, whereby, when the voltage Vc tends to go negative, the transistor T3 begins conducting through the resistor R1; as a result, the transistor T2 will also be conducting and supply the resonant load with the required current to hold the collector of the transistor T1 at a voltage close to zero during the time when it would tend to go negative due to the capacitance present at the resonant load.

Again in FIG. 5, it can be seen that, as Vc becomes positive, perhaps by more than 400 volts in the instance of a circuit driving an automotive ignition coil, the emitter-base junction of the transistor T3 is also to withstand that voltage. In fact, its base is connected to a potential of about 0.7 volts, whilst its emitter is connected to the collector of the high-voltage transistor T1. This junction, which is to withstand high voltages, can be readily implemented in the VIPower technology employed for making the integrated structures shown in FIGS. 3 and 7. FIG. 7 shows indeed an embodiment wherein the base-emitter junction of the transistor T3, the regions 3 and 12, is provided by diffused regions similar to those, the regions 3 and 7, utilized to form the collector and base, respectively, of the transistor T1, which is a high-voltage power transistor.

To summarize, this invention does provide a circuit for limiting the output voltage from a power transistor arranged to drive a resonant load, which circuit is quite simple construction-wise and affords significant savings in integrated circuit area compared to prior art solutions. In particular, the area occupied by the limiter circuit of this invention is ten times smaller than the area occupied by the prior circuit described in the above-referenced patent application. Furthermore, the manufacture of the circuit is specially advantageous where the circuit is implemented in the VIPower technology, as is normally used for power devices which incorporate a logic control portion.

I claim:

1. A circuit for driving a resonant load which has a first end connected to a voltage source and has a second end, the circuit for driving the resonant load comprising:

a power transistors having a control element and a conductive path between the second end of the resonant load and a ground voltage;

a means for controlling the power transistor connected to the control element of the power transistor;

a semiconductor junction element for limiting an output voltage of the power transistor, the semiconductor junction having a first, a second, and a third terminals, the first terminal connected to the voltage source, the second terminal connected to a common circuit node between the power transistor and the resonant load, and the third terminal connected to a reference voltage of a predetermined value.

2. A circuit according to claim 1 wherein the semiconductor junction element comprises an SCR diode wherein the first, the second, and third terminals correspond respectively to an anode terminal, a cathode terminal, and a control terminal of the SCR diode.

3. A circuit according to claim 2 wherein the SCR diode further comprises a first transistor and a second transistor of a mutually complementary type.

4. A circuit according to claim 3 wherein the first transistor comprises a PNP bipolar transistor having an emitter, a collector, and a base; and the second transistor comprises an NPN transistor having an emitter, a collector, and a base; wherein the emitter of the first transistor forms the anode terminal of the SCR diode, the base of the first transistor connects to the collector of the second transistor, the collector of the first transistor connects to the base of the second transistor to form the control terminal of the SCR diode, and the emitter of the second transistor forms the cathode terminal of the SCR diode.

5. The circuit of claim 3 wherein the power transistor and the first and second transistor are formed on a semiconductor substrate, the semiconductor substrate formed with four superimposed layers alternately doped with impurities of the P type and the N type, and having a respective base, collector, and emitter regions.

6. A circuit according to claim 5 wherein the cathode terminal of the SCR diode corresponds to the emitter region of the first transistor and is formed in the first of said layers, doped with impurities of the P type; the control terminal of the SCR diode corresponds to the base region of the first transistor and to the collector region of the second transistor, and is formed in the second of said layers, doped with impurities of the N type; the anode terminal of the SCR diode corresponds to the emitter region of the second transistor and is formed in the fourth of said layers, doped with impurities of the N type; and the collector region of the first transistor and the base region of the second transistor are formed in the third of said layers, doped with impurities of the P type.

7. A circuit according to claim 1 wherein the reference voltage is generated by forward biasing a diode with a resistor.

8. An ignition circuit in an automobile comprising:

a resonant load which has a first end connected to a voltage source and has a second end;

a power transistors having a control element and a conductive path between the second end of the resonant load and a ground voltage;

a means for controlling the power transistor connected to the control element of the power transistor;

a semiconductor junction element for limiting an output voltage of the power transistor, the semiconductor junction having a first, a second, and a third terminals, the first terminal connected to the voltage source, the second terminal connected to a common circuit node between the power transistor and the resonant load, and the third terminal connected to a reference voltage of a predetermined value.

9. A circuit according to claim 8 wherein the semiconductor junction element comprises an SCR diode wherein the first, the second, and the third terminals correspond respectively to an anode terminal, a cathode terminal, and a control terminal of the SCR diode.

10. A circuit according to claim 9 wherein the SCR diode further comprises a first transistor and a second transistor of a mutually complementary type.

11. A circuit according to claim 10 wherein the first transistor comprises a PNP bipolar transistor having an emitter, a collector, and a base; and the second transistor comprises an NPN transistor having an emitter, a collector, and a base; wherein the emitter of the first transistor forms the anode terminal of the SCR diode, the base of the first transistor connects to the collector of the second transistor, the collector of the first transistor connects to the base of the second transistor to form the control terminal of the SCR diode, and the emitter of the second transistor forms the cathode terminal of the SCR diode.

12. The circuit of claim 10 wherein the power transistor and the first and second transistor are formed on a semiconductor substrate, the semiconductor substrate formed with four superimposed layers alternately doped with impurities of the P type and the N type, and having a respective base, collector and emitter regions.

13. A circuit according to claim 12 wherein the cathode terminal of the SCR diode corresponds to the emitter region of the first transistor and is formed in the first of said layers, doped with impurities of the P type; the control terminal of the SCR diode corresponds to the base region of the first transistor and to the collector region of the second transistor, and is formed in the second of said layers, doped with impurities of the N type; the anode terminal of the SCR diode corresponds to the emitter region of the second transistor and is formed in the fourth of said layers, doped with impurities of the N type; and the collector region of the first transistor and the base region of the second transistor are formed in the third of said layers, doped with impurities of the P type.

14. A circuit according to claim 8 wherein the reference voltage is generated by forward biasing a diode with a resistor.

15. A circuit for driving a resonant load which has a first end connected to a voltage source and has a second end, the circuit for driving the resonant load comprising:

a power transistors having a control element and a conductive path between the second end of the resonant load and a ground voltage;

a means for controlling the power transistor connected to the control element of the power transistor;

a means for limiting an output voltage of the power transistor having a first, a second, and a third terminals, the first terminal connected to the voltage source, the second terminal connected to a common circuit node between the power transistor and the resonant load, and the third terminal connected to a reference voltage of a predetermined value.

16. A circuit according to claim 15 wherein the means for limiting an output voltage of the power transistor comprises an SCR diode wherein said the first, the second, and third terminals correspond respectively to an anode terminal, a cathode terminal, and a control terminal of the SCR diode.

17. A circuit according to claim 16 wherein the SCR diode further comprises a first transistor and a second transistor of a mutually complementary type.

18. A circuit according to claim 17 wherein the first transistor comprises a PNP bipolar transistor having an emitter, a collector, and a base; and the second transistor comprises an NPN transistor having an emitter, a collector, and a base; wherein the emitter of the first transistor forms the anode terminal of the SCR diode, the base of the first transistor connects to the collector of the second transistor, the collector of the first transistor connects to the base of the second transistor to form the control terminal of the SCR diode, and the emitter of the second transistor forms the cathode terminal of the SCR diode.

19. The circuit of claim 17 wherein the power transistor and the first and second transistor are formed on a semiconductor substrate, the semiconductor substrate formed with four superimposed layers alternately doped with impurities of the P type and the N type, and having a respective base, collector, and emitter regions.

20. A circuit according to claim 19 wherein the cathode terminal of the SCR diode corresponds to the emitter region of the first transistor and is formed in the first of said layers, doped with impurities of the P type; the control terminal of the SCR diode corresponds to the base region of the first transistor and to the collector region of the second transistor, and is formed in the second of said layers, doped with impurities of the N type; the anode terminal of the SCR diode corresponds to the emitter region of the second transistor and is formed in the fourth of said layers, doped with impurities of the N type; and the collector region of the first transistor and the base region of the second transistor are formed in the third of said layers, doped with impurities of the P type.

\* \* \* \* \*